United States Patent [19]

Romero et al.

[11] Patent Number: 5,616,886
[45] Date of Patent: Apr. 1, 1997

[54] WIREBONDLESS MODULE PACKAGE

[75] Inventors: Guillermo L. Romero, Scottsdale; Samuel J. Anderson, Tempe, both of Ariz.

[73] Assignee: Motorola, Schaumburg, Ill.

[21] Appl. No.: 464,112

[22] Filed: Jun. 5, 1995

[51] Int. Cl.⁶ .................................................. H01L 23/02
[52] U.S. Cl. .................... 174/52.4; 257/678; 257/700; 257/729
[58] Field of Search ................... 174/52.1, 52.4; 257/678, 685, 700, 711, 729, 750, 754, 760, 765, 771; 361/795; 29/825, 830, 831, 832, 852

[56] References Cited

U.S. PATENT DOCUMENTS

| H1245 | 10/1993 | Griswold et al. | 439/620 X |
|---|---|---|---|
| 3,626,259 | 12/1971 | Garboushian et al. | 257/705 |
| 3,777,221 | 12/1973 | Tatusko et al. | 29/626 X |
| 3,846,734 | 11/1974 | Pauza et al. | 174/52.4 X |
| 4,455,448 | 6/1984 | Bertolina | 174/35 R |
| 4,627,533 | 12/1986 | Pollard | 206/328 |
| 4,837,664 | 6/1989 | Rodriguez, II et al. | 361/716 |
| 4,903,169 | 2/1990 | Kitagawa | 29/840 X |
| 5,111,277 | 5/1992 | Medeiros, III et al. | 257/720 |
| 5,146,314 | 9/1992 | Pankove | 257/712 |
| 5,412,340 | 5/1995 | Tanikoshi | 330/68 |
| 5,418,329 | 5/1995 | Katoh et al. | 174/52.3 |
| 5,461,196 | 10/1995 | Virga et al. | 174/57.4 |
| 5,465,481 | 11/1995 | Romero | 29/840 |

*Primary Examiner*—Bot L. Ledynh
*Attorney, Agent, or Firm*—Eugene A. Parsons

[57] ABSTRACT

A wirebondless module package and method of fabrication including a molded preform of porous SiC with a cavity having therein an AlN substrate defining a plurality of pockets. The preform being infiltrated with Al and the Al being deposited in each of the pockets. A semiconductor die mounted on the Al in one of the pockets. A dielectric layer covering the Al and defining openings therethrough positioned to expose the aluminum and a connection to the die. A conductive material positioned on the dielectric layer in contact with the die and the Al so as to define terminals and interconnections between the die and the terminals.

9 Claims, 4 Drawing Sheets

WIREBONDLESS MODULE PACKAGE

FIELD OF THE INVENTION

The present invention pertains to module packages containing one or more semiconductor chips with many semiconductor devices on each chip.

BACKGROUND OF THE INVENTION

In many applications, semiconductor die are fabricated in the form of modules containing pluralities of semiconductor devices. These modules are then packaged in some desirable form to fit the specific application. To package the modules it is necessary to interconnect the various semiconductor devices and/or die and then connect the devices and/or die to external leads through which the package can be electrically connected into a circuit. The major problem that arises is that the interconnections and connections to external leads generally are formed with wire bonding.

The wire bonding process is slow, expensive and contributes significantly to low yields. As is known in the field, wire bonding machines are very expensive and must be reprogrammed for each different module and/or package that is manufactured. Also, wire bonding machines have a strong tendency to damage semiconductor die as they bond. Wire bonds are easily broken during packaging and, because they must be positioned above the surface of the semiconductor die and/or modules, add substantially to the size of the final package.

As an example, in power packages it is not unusual to have as many as 10–30 devices connected in parallel. Generally each of the devices is a multi-element device requiring a number of connections, or wirebond pads, per device. Also, the power package generally contains some type of controls and/or electronic switch which includes a plurality of connections. A typical power package could include from tens to hundreds of wirebonds, each of which is an opportunity for the wirebonder to damage the semiconductor die. Even if the wirebonding machine parameters for one run are set and optimized, slight variations in force, energy, fixture alignment, cutter residue buildup, or other parameters can create a condition where semiconductor die are damaged.

It would be advantageous from several perspectives to develop a technology that would not require wirebonding.

Accordingly, it is a purpose of the present invention to provide wirebondless module packages.

It is another purpose of the present invention to provide new and improved methods of fabricating module packages to eliminate the necessity for wirebonds.

It is still another purpose of the present invention to provide new and improved wirebondless module packages which are smaller and more rugged than prior packages.

It is still another purpose of the present invention to provide new and improved wirebondless module packages which are manufactured using standard semiconductor processing techniques.

It is a further purpose of the present invention to provide new and improved wirebondless module packages which include a heat sink in the process.

SUMMARY OF THE INVENTION

The above problems and others are at least partially solved and the above purposes and others are realized in a method of fabricating a wirebondless module package including providing a preform with a cavity defined therein, providing dielectric partitions in the cavity dividing the cavity into a plurality of separate areas and positioning a plurality of portions of a first conductive material, one each in each of the plurality of areas, the dielectric partitions electrically insulating each portion of the first conductive material from all other portions of the first conductive material. A semiconductor die is then mounted on a first portion of the first conductive material in one of the plurality of areas and a dielectric layer is positioned over the plurality of portions of the first conductive material in each of the plurality of areas, the dielectric layer having openings defined therethrough and positioned to expose surfaces of portions of the first conductive material and to expose a connection to the semiconductor die. Portions of a second conductive material are then positioned on the dielectric layer so as to contact the connection to the semiconductor die and the exposed surfaces of the portions of the first conductive material and to define external terminals and interconnections between the semiconductor die and the external terminals.

In a preferred embodiment the preform is molded from porous silicon carbide and the dielectric partitions are provided as a molded or pressed substrate of aluminum nitride with a plurality of pockets formed therein. The substrate is placed in the cavity in the preform and the preform and pockets are infiltrated with aluminum. The semiconductor die is mounted on the aluminum and interconnections are formed between the die and external connections.

BRIEF DESCRIPTION OF THE DRAWINGS

Referring to the drawings.

DESCRIPTION OF THE PREFERRED EMBODIMENT

Figure 1:
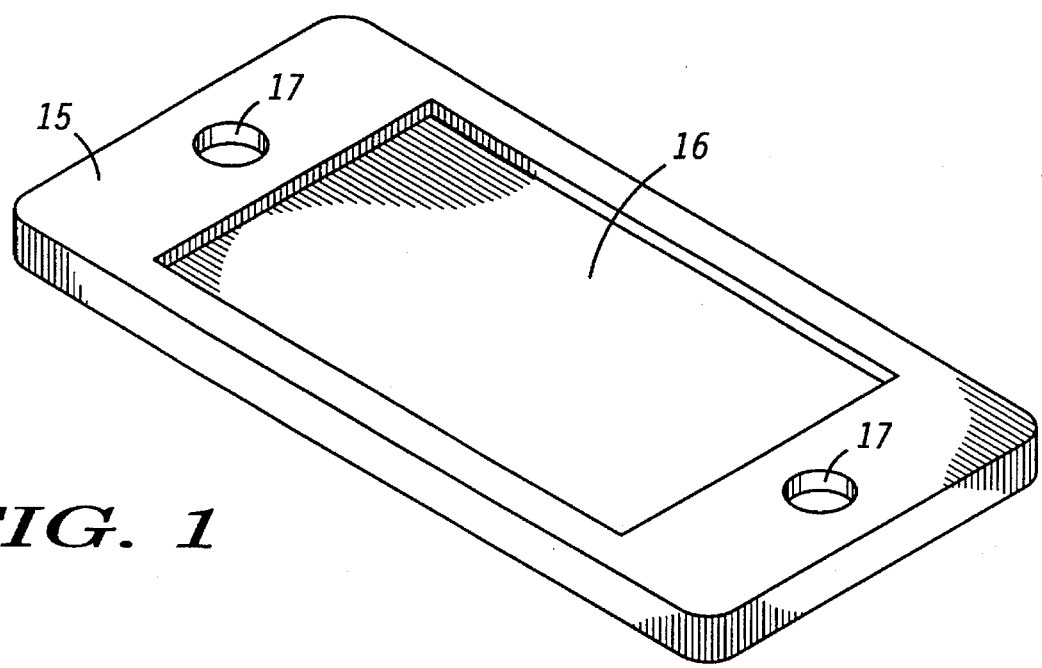
FIGS. 1 through 9 illustrate various steps in a process of fabricating a wirebondless module package in accordance with the present invention.

Turning now to FIGS. 1 through 9 various steps in a process of fabricating a wirebondless module package in accordance with the present invention are illustrated. Referring specifically to FIG. 1, a preform 15 is illustrated having a centrally located generally rectangularly shaped cavity 16 formed therein. In this specific example, preform 15 is formed by molding porous silicon carbide (SIC) into the desired shape in a well known processes. Also, in this specific example, for a complete understanding as to the general sizes being discussed, preform 15 is approximately 1 inch wide, 2 inches long and 0.055 inches thick. In addition to cavity 16, preform 15 is formed with mounting holes 17 extending therethrough on each side of cavity 16. It will of course be understood from the description below that while a single cavity is illustrated in this specific example, additional cavities could be formed, if desired, and utilized as will be explained for cavity 16.

Figure 2:
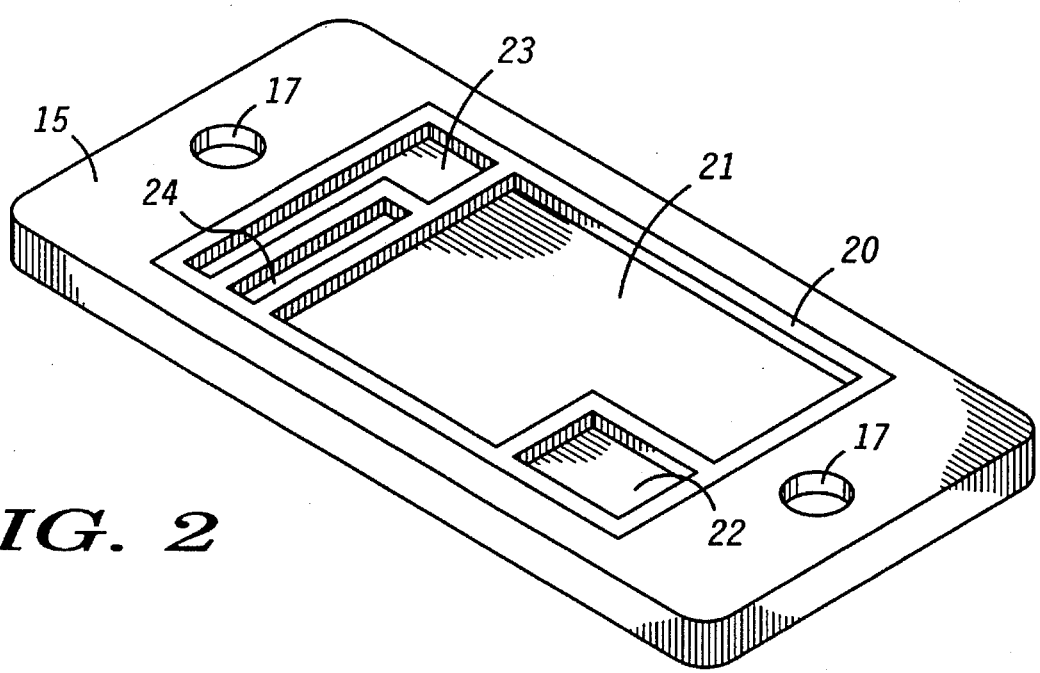

Referring now to FIG. 2, a plurality of dielectric partitions are formed in cavity 16 to divide cavity 16 into a plurality of separate areas. In this specific example the partitions are provided by forming a dielectric substrate 20 to fit within cavity 16 in preform 15. Substrate 20 is molded or pressed from an insulating material such as a ceramic like aluminum nitride (AlN), aluminum oxide ($Al_2O_3$), berylium oxide (BeO), etc. in a well known process and includes separate areas 21, 22, 23 and 24, all of which are electrically insulated from each other by the walls or partitions of substrate 20. With substrate 20 frictionally engaged in cavity 16 (as shown in FIG. 2), it should be noted that separate areas 21–24 are generally outwardly opening depressions or pockets formed in substrate 20 and can have substantially any desired shape.

With substrate 20 frictionally engaged in cavity 16, the entire structure is placed in a mold and infiltrated with a liquid aluminum alloy which is then cooled to solidify the aluminum. The infiltration process, as is known in the art, fills the interstices of the porous silicon carbide so that the newly formed metal matrix composite (MMC) becomes a very good conductor of heat. Also, the infiltration fixedly engages substrate 20 in cavity 16 and forms electrically conductive surfaces in each of areas 21–24. As will be understood by those skilled in the art, the electrically conductive aluminum surfaces in each of areas 21–24 are electrically isolated from each other but, because the aluminum nitride is relatively thin and is capable of conducting heat, the MMC baseplate (including preform 15) operates as a heat sink for the entire structure.

Figure 3:
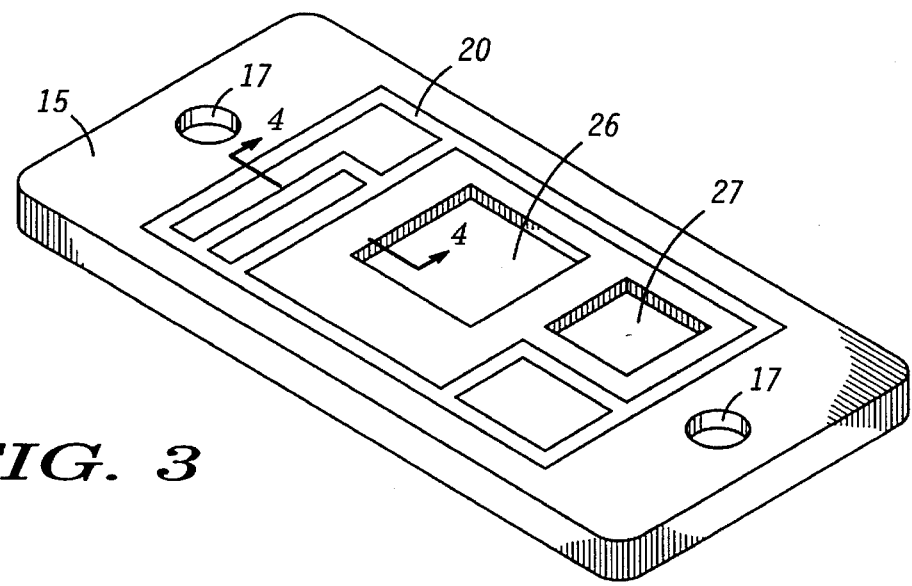
Figure 4:
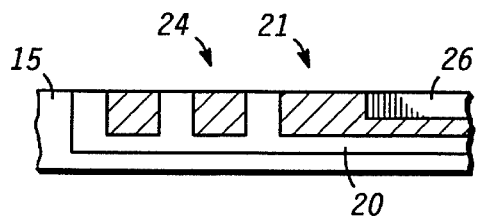

As can be seen by referring to FIG. 3, areas 22, 23 and 24 are filled with aluminum substantially level with the edges of substrate 20 and area 21 is filled with aluminum so as to define two shallow cavities 26 and 27. A cross-sectional view illustrating the relationship of substrate 20 in cavity 16 and the aluminum in substrate 20, including shallow cavity 26, is illustrated in FIG. 4. It should be noted that shallow cavities 26 and 27 are both formed in aluminum area 21 and, therefore, are not electrically insulated from each other.

Figure 5:
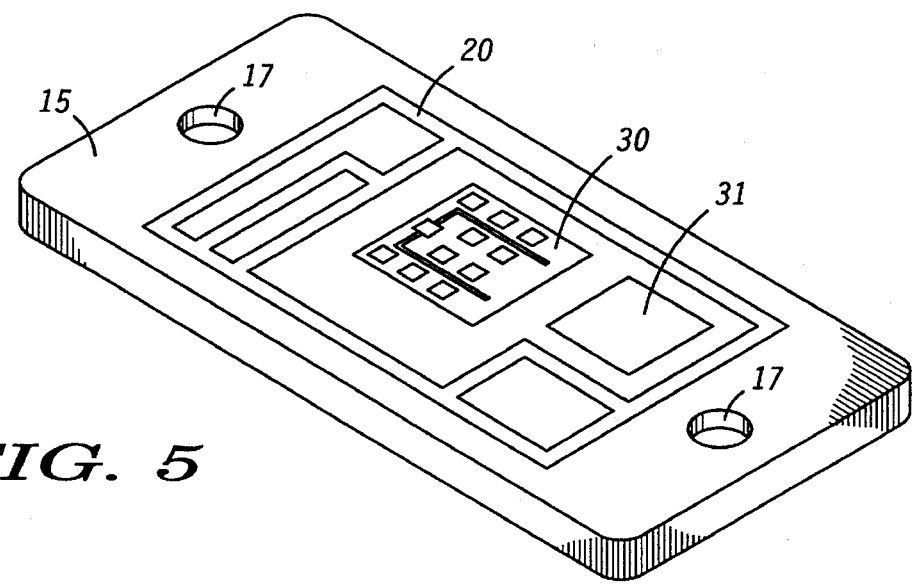

Turning now to FIG. 5, semiconductor die 30 and 31 are mounted in shallow cavities 26 and 27, respectively, by any convenient means, such as soldering, conductive adhesive, etc. In this specific example, the lower or rear surfaces of die 30 and 31 are physically and electrically connected to the surface the aluminum in area 21. Here it should be noted that shallow cavities 26 and 27 are formed with a depth such that the upper surfaces of semiconductor die 30 and 31 are substantially level with the upper surface of the aluminum in area 21 and in areas 22–24. Thus, the upper surface of the entire structure is substantially planar.

In this specific example, die 30 includes a plurality of insulated gate bipolar transistor (IGBT) cells, connected in parallel to form a high power IGBT switch, and an emitter sensing circuit designed to determine the status of the switch. The lower (reverse) surface of die 30 is one terminal of the circuit, specifically the collector. The upper surface has emitter connections, gate connections and the sense circuit. Die 31 includes a plurality of diodes connected in parallel to form a power diode with the lower (reverse) surface of die 31 being one terminal of the plurality of diodes and the upper surface being the opposite terminal.

A layer 35 of dielectric material is deposited or positioned over cavity 15 so as to cover all of the die and aluminum in cavity 15. As will be explained presently, layer 35 will remain in the finished structure and should be selected with characteristics such that it will not be damaged during later operations. As a typical example, layer 35 can include or be formed of standard photoresist or polyimide photoresist. These materials are relatively easy to form into the desired layer and to operate on once the layer is formed.

Figure 6:
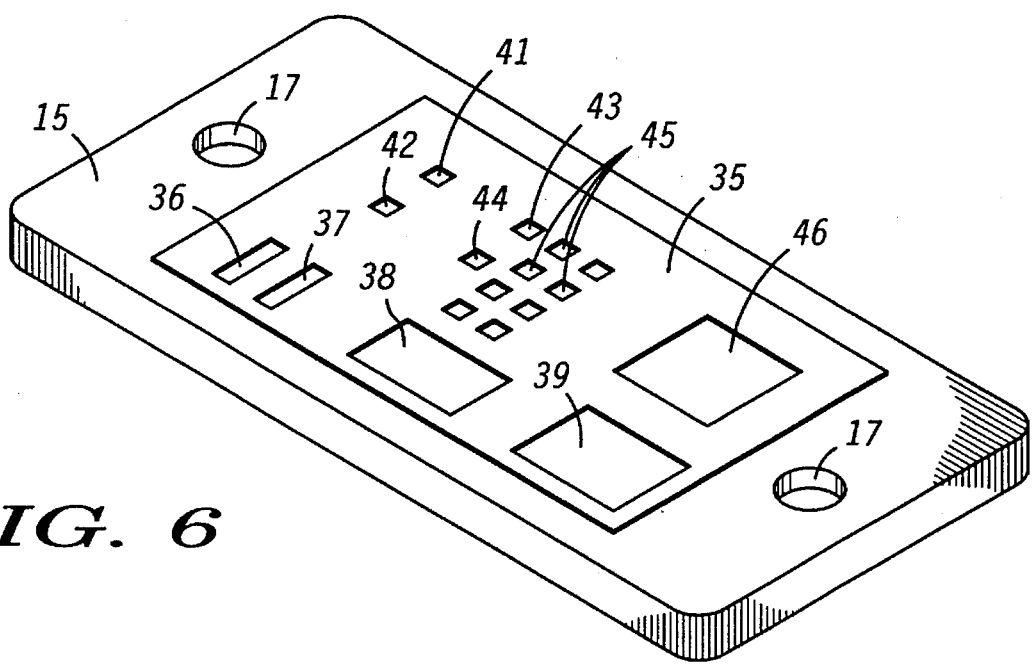

A plurality of openings are formed through layer 35, as illustrated in FIG. 6, so as to expose surfaces of portions of the aluminum in areas 21–24 and to expose connections to semiconductor die 30 and 31. Specifically, in this example, openings 36, 37, 38 and 39 are formed to expose portions of the surfaces of the aluminum in areas 23, 24, 21 and 22, respectively. A pair of spaced apart openings 41 and 42 are formed through layer 35 so as to expose the surface of a portion of the aluminum in area 23 and a portion of the aluminum in area 24. A second pair of openings 43 and 44 are formed in spaced relationship to openings 41 and 42 and in overlying relationship to connections on die 30 to the emitter sense circuit and to a gate circuit for each of the IGBT, respectively. A plurality of openings 45 (eight) are formed through layer 35 overlying die 30 so as to expose connections to the emitters of each of the IGBT. Also, an opening 46 is formed through layer 35 so as to expose a connection to the upper surface of die 31. It will of course be understood that layer 35 and the openings therethrough can be formed in a variety of processes including but not limited to the well known and relatively simple process of masking, exposing, and removing the exposed areas if layer 35 is a photoresist material.

As will be described in more detail presently, openings 36–39 define external terminals for the module and, therefore, are relatively large so that a relatively large electrical connection can be made thereto. Also, it can be seen by referring back to FIG. 5, that the aluminum in area 23 connects opening 41 to opening 36 and the aluminum in area 24 connects opening 42 to opening 37. Further, as will be seen presently, the aluminum in area 22 serves as a connection pad, as well as an external terminal.

Figure 7:
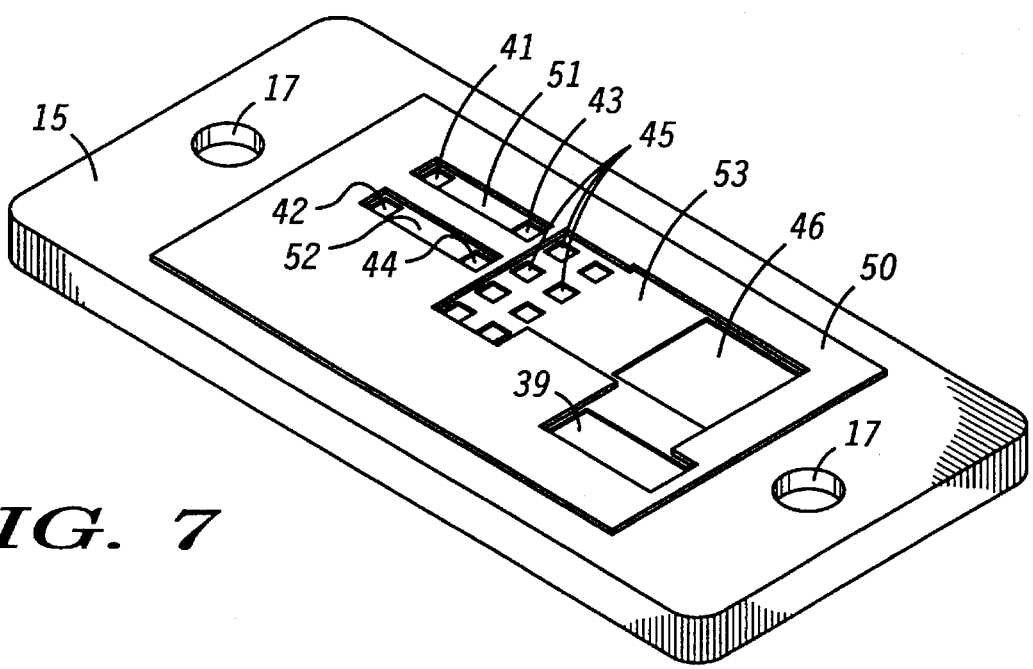

The next step in the process, as illustrated in FIG. 7, includes placing a conductor plating mask 50 over layer 35 so as to leave exposed appropriate surface areas of layer 35 and the openings therethrough. Specifically, mask 50 has an opening 51 exposing openings 41 and 43 in layer 35 and the portion of layer 35 extending therebetween; a second opening 52 exposing openings 42 and 44 in layer 35 and the portion of layer 35 extending therebetween and a large third opening 53 exposing openings 45, 46 and a portion of 39 through layer 35 and the portion of layer 35 therebetween. Interconnecting metal, e.g. aluminum, copper, etc., is then deposited on the exposed surface areas by any convenient process, including but not limited to vapor deposition, electro plating, electro-less plating, or the like. Mask 50 and any extraneous metal is then removed to leave the electrical interconnects illustrated in FIG. 8.

Figure 8:
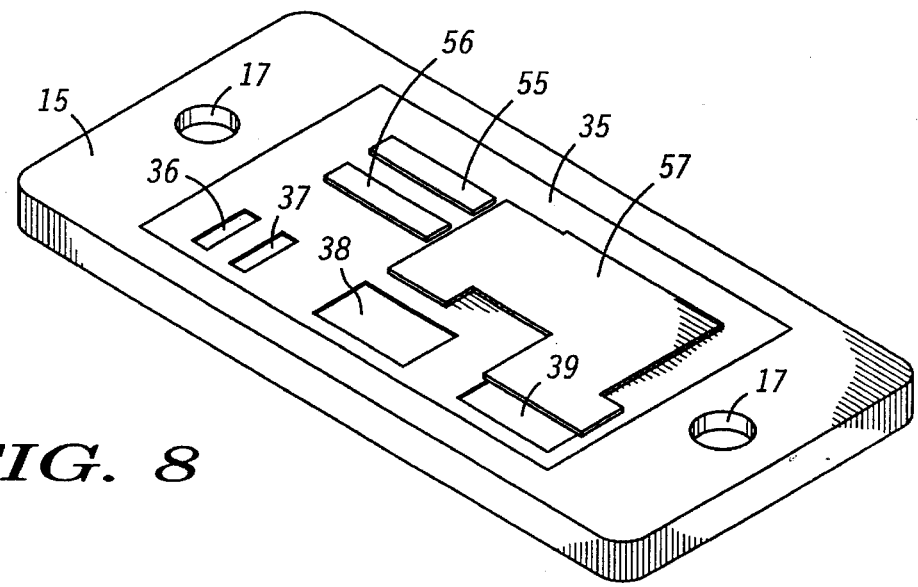

As can be seen by referring to FIG. 8, a strip 55 of interconnect metal is formed by opening 51 in mask 50, a strip 56 of interconnect metal is formed by opening 52 and a relatively large patch 57 of interconnect metal is formed by opening 53. Strip 55 electrically connects the sense circuit on die 30 through opening 43 to the aluminum in area 23, a portion of which is exposed to define an external terminal at opening 36. Strip 56 electrically connects the gate of the IGBT on die 30 through opening 44 to the aluminum in area 24, a portion of which is exposed to define an external terminal at opening 37. Patch 57 interconnects the emitters of the IGBT on die 30 through openings 45 with the upper terminal (anode) of the diode on die 31 through opening 46 and, further, connects the emitters and diodes to the aluminum in area 22, a portion of which is exposed to define an external terminal in opening 39.

Figure 9:
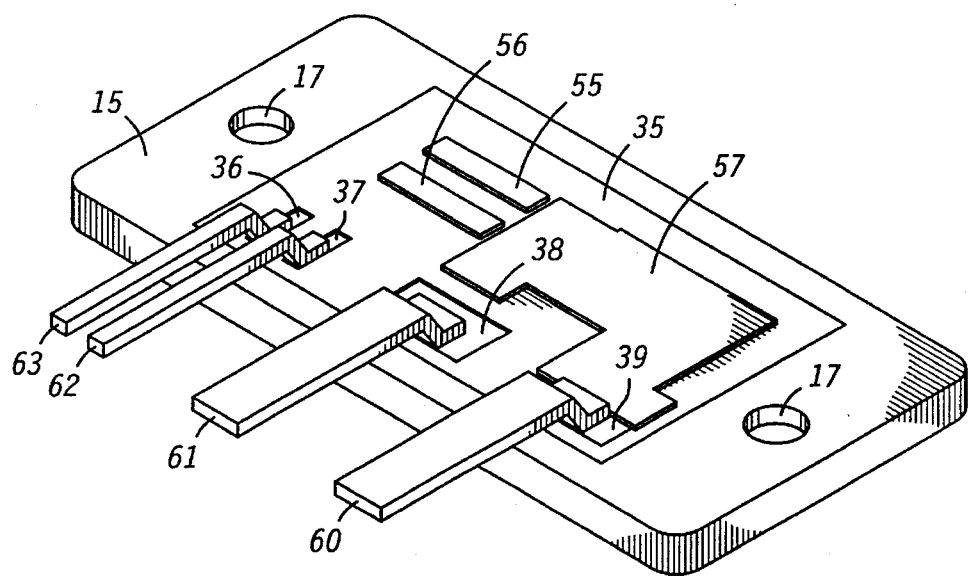

Referring now to FIG. 9, a plurality of leads 60–63 are affixed to the exposed aluminum in openings 36–39, respectively. Leads 60–63 can be attached by any convenient process, including but not limited to spot welding, soldering, etc. In this example leads 60–63 are illustrated as being formed separately and attached after the fabrication of the module package, however, it should be understood that the leads could be formed as a single lead frame or during the previous step as an integral part of the interconnect metal.

Figure 10:
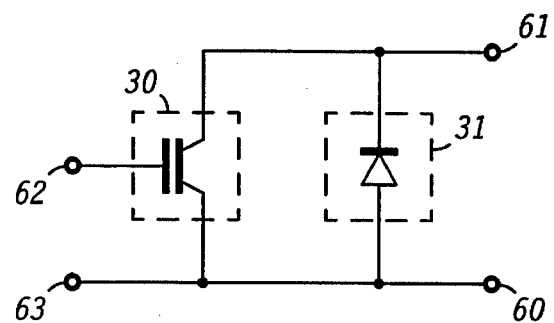
FIG. 10 is a schematic representation of the module of FIG. 9.

A schematic diagram of the module circuit is illustrated in FIG. 10 for convenience of understanding the present structure. Lead 60 is electrically connected, through the aluminum in area 22, to interconnect metal patch 57, which is in turn connected to one side of the diodes (the anode) on die 31 and to the emitters of the IGBT on die 30. Lead 61 is electrically connected to the aluminum in area 21, which is also connected to the lower or reverse side of the diodes (the cathode) on die 31 and to the lower or reverse side of die 30 (the collector of the IGBT). Lead 62 is connected to the aluminum in area 24 which is electrically connected through interconnect metal link 56 to the gate circuit of the IGBT on die 30. Also, lead 63 is connected to the aluminum in area 24 which is electrically connected through interconnect metal link 55 to the emitter sense circuit of the IGBT on die 30.

With all of the connections provided as illustrated in FIG. 9, the package can be conveniently encapsulated for protection or incorporated into a larger control circuit, if desired. While specific components and a specific circuit are described herein for purposes of explaining the process and wirebondless module package, it will be understood by those skilled in the art that the novel fabrication process could be utilized to fabricate a wide variety of modules including from one to a large plurality of semiconductor dies.

Utilizing mounting holes 17, the package can be conveniently affixed to a larger heat sink, if desired, and the aluminum impregnated silicon carbide of preform 15 provides a ready path for removing heat from package. Further, the entire package is fabricated utilizing standard semiconductor process techniques without the need for any wirebonding or the like. The terminals and interconnections provided are relatively easily formed with no damage to the circuitry or components and are large and rugged so that they can adequately carry the required current and provide reliable connections and interconnections to and within the package. Also, the deposited leads are of a geometry that reduces parasitic inductances over prior art wire bonded leads.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A wirebondless module package comprising:

a preform with a cavity defined therein;

dielectric partitions positioned in the cavity and dividing the cavity into a plurality of separate areas;

a plurality of portions of a first conductive material, one each positioned in each of the plurality of separate areas, the dielectric partitions electrically insulating each of the plurality of portions of the first conductive material from all other of the plurality of portions of the first conductive material;

a semiconductor die mounted on a first portion of the first conductive material in one of the plurality of areas;

external terminals defined on the plurality of portions of the first conductive material; and metallic depositions extending between the semiconductor die and the external terminals providing interconnections therebetween.

2. A wirebondless module package comprising:

a preform with a cavity defined therein;

dielectric partitions positioned in the cavity and dividing the cavity into a plurality of separate areas;

a plurality of portions of a first conductive material, one each positioned in each of the plurality of separate areas, the dielectric partitions electrically insulating each of the plurality of portions of the first conductive material from all other of the plurality of portions of the first conductive material;

a semiconductor die mounted on a first portion of the first conductive material in one of the plurality of areas;

a dielectric layer positioned over the plurality of portions of the first conductive material in each of the plurality of areas, the dielectric layer having openings defined therethrough and positioned to expose surfaces of portions of the first conductive material and to expose a connection to the semiconductor die; and portions of a second conductive material positioned on the dielectric layer so as to contact the connection to the semiconductor die and the exposed surfaces of the portions of the first conductive material, the second conductive material defining external terminals and interconnections between the semiconductor die and the external terminals.

3. A wirebondless module package as claimed in claim 2 wherein the preform includes molded porous silicon carbide.

4. A wirebondless module package as claimed in claim 3 wherein the dielectric partitions in the cavity include a dielectric substrate positioned within the cavity and defining a plurality of separate areas.

5. A wirebondless module package as claimed in claim 4 wherein the dielectric substrate includes one of pressed or molded aluminum nitride, aluminum oxide, or berylium oxide.

6. A wirebondless module package as claimed in claim 5 wherein the molded porous silicon carbide preform is infiltrated with aluminum or aluminum alloy.

7. A wirebondless module package as claimed in claim 6 wherein the plurality of portions of a first conductive material include aluminum.

8. A wirebondless module package comprising:

a molded preform of porous silicon carbide with a cavity defined therein;

an aluminum nitride substrate having a plurality of pockets defined therein and positioned in the cavity with the plurality of pockets opening outwardly so as to divide the cavity into the plurality of separate areas;

the molded preform being infiltrated with aluminum and the aluminum being deposited in each of the plurality of separate areas, the plurality of pockets of the substrate electrically insulating the aluminum in each of the separate areas from the aliminum in all of the other areas;

a semiconductor die mounted on the aluminum in one of the plurality of areas;

a dielectric layer positioned over the aluminum in each of the plurality of areas, the dielectric layer having openings defined therethrough, with the openings being positioned to expose surfaces of the aluminum and to expose a connection to the semiconductor die; and portions of a conductive material positioned on the dielectric layer in contact with the connection to the semiconductor die and the exposed surfaces of the aluminum and the conductive material defining external terminals and interconnections between the semiconductor die and the external terminals.

9. A wirebondless module package as claimed in claim 8 including leads attached to the external terminals.

* * * * *